United States Patent
Shao et al.

(10) Patent No.: US 11,744,040 B2
(45) Date of Patent: Aug. 29, 2023

(54) OPTIMAL CONTROL LOGIC IN LIQUID COOLING SOLUTION FOR HETEROGENEOUS COMPUTING

(71) Applicant: Baidu USA LLC, Sunnyvale, CA (US)

(72) Inventors: Shuai Shao, Milpitas, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 556 days.

(21) Appl. No.: 16/827,353

(22) Filed: Mar. 23, 2020

(65) Prior Publication Data

US 2021/0298202 A1    Sep. 23, 2021

(51) Int. Cl.
| | | |
|---|---|---|
| H05K 7/20 | (2006.01) | |
| G05B 13/00 | (2006.01) | |
| G05B 19/416 | (2006.01) | |
| H05K 7/14 | (2006.01) | |
| G05B 15/02 | (2006.01) | |

(52) U.S. Cl.
CPC ....... *H05K 7/20281* (2013.01); *G05B 19/416* (2013.01); *H05K 7/1488* (2013.01); *H05K 7/20272* (2013.01); *G05B 13/00* (2013.01); *G05B 15/02* (2013.01); *G05B 2219/49216* (2013.01)

(58) Field of Classification Search
None
See application file for complete search history.

(56) References Cited

U.S. PATENT DOCUMENTS

| | | | | |
|---|---|---|---|---|
| 7,885,070 B2* | 2/2011 | Campbell | .......... | H05K 7/20809 361/698 |
| 7,905,096 B1* | 3/2011 | Campbell | .......... | H05K 7/20836 62/93 |
| 7,991,515 B2* | 8/2011 | Lyon | ........................ | G06F 1/206 713/340 |
| 9,250,024 B2* | 2/2016 | Campbell | ............... | F28F 3/048 |
| 9,848,514 B2* | 12/2017 | Shelnutt | .................... | G06F 1/20 |
| 9,852,963 B2* | 12/2017 | Shedd | ........................ | F28F 9/26 |
| 10,162,396 B2* | 12/2018 | Cui | ..................... | H05K 7/20772 |
| 10,674,635 B2* | 6/2020 | Gao | ................... | H05K 7/20745 |
| 10,980,154 B1* | 4/2021 | Gao | .................... | H05K 7/20781 |

(Continued)

*Primary Examiner* — Courtney L Smith
(74) *Attorney, Agent, or Firm* — WOMBLE BOND DICKINSON (US) LLP (57) ABSTRACT

An electronic rack includes an array of server blades arranged in a stack. Each server blade contains one or more servers and each server includes one or more processors to provide data processing services. The electronic rack includes a coolant distribution unit (CDU) and a rack management unit (RMU). The CDU supplies cooling liquid to the processors and receives the cooling liquid carrying heat from the processors. The CDU includes a liquid pump to pump the cooling liquid. The RMU is configured to manage the operations of the components within the electronic rack such as CDU, etc. The RMU includes control logic to determine an optimal pump speed to minimize the total power consumption of the pump, acceleration servers and the host servers, based on the one or more parameters and the association between temperature and power consumption of the acceleration servers and the host servers. The RMU then controls the liquid pump based on the optimal pump speed.

7 Claims, 6 Drawing Sheets

(56) References Cited

U.S. PATENT DOCUMENTS

| | | | |
|---|---|---|---|
| 11,019,752 B2* | 5/2021 | Gao | H05K 7/20272 |
| 11,140,799 B2* | 10/2021 | Gao | H05K 7/20818 |
| 11,212,943 B2* | 12/2021 | Heydari | H05K 7/20781 |
| 2014/0029193 A1* | 1/2014 | Alshinnawi | H05K 7/20772 |
| | | | 361/679.49 |

* cited by examiner

OPTIMAL CONTROL LOGIC IN LIQUID COOLING SOLUTION FOR HETEROGENEOUS COMPUTING

FIELD OF THE DISCLOSURE

Embodiments of the present invention relate generally to data centers. More particularly, embodiments of the invention relate to optimal control of a liquid cooling solution in heterogeneous computing electronic racks of a data centers.

BACKGROUND

Thermal management of high power density chips and processors are critical problems, especially with the increasing of power density of high end chips, such as CPUs (central processing units) and GPUs (graphics processing units). Cooling devices are utilized in cooling system designs for maintaining the thermal conditions of the chips by removing the heat generated by the chips. If the temperature exceeds the limitation of the thermal specification, the chips may not function properly and throttling may happen. In addition, by providing proper or better thermal conditions for the chip when it is working, better performance or less power consumption can be achieved.

High performance machine learning computing is enabled by high power density processors, such as data center GPUs. The conventional air-cooling solution is struggling to handle the thermal management challenge in such GPU racks. Instead, cold plate liquid cooling solution provides much better cooling performance and saves energy consumption in cooling infrastructure.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure focus on minimizing power consumption of a liquid cooled IT rack. A liquid cooled IT rack may include liquid cooled CPU servers and liquid cooled GPU servers. The IT rack may include a liquid cooling system comprised of liquid cooling equipment such as a liquid cooling pump and liquid cooling distribution channels (e.g., liquid cooling manifolds) to distribute liquid cooling to the servers of the IT rack. In some embodiments, the CPU servers may act as host servers for the GPU servers (e.g., a CPU server may delegate operations to one or more corresponding GPU server). Certain computing tasks may require heterogeneous computing (i.e., utilizing resources of both CPU and GPU servers) to improve efficiency of the computing task. In some embodiments, a test run (or commission test) may be performed on the IT rack to collect operating parameters of the IT rack that are related to the power consumption and operating efficiency of the IT rack. The parameters may be stored in a controller and may be used as constants in performing a calculation of an optimal pump speed of a liquid pump. The optimal pump speed may minimize the power consumption of the servers and cooling equipment of the IT rack. In particular, the optimal pump speed may minimize the power consumption of the IT rack by considering the 1) power consumption of GPU servers, 2) power consumption of the CPU servers, and 3) power consumption of the cooling equipment, all in view of the pump speed of the liquid pump and utilization rates of the GPU servers and CPU servers.

According to one aspect, an electronic rack of a data center includes an array of server blades arranged in a stack. Each server blade may contain host servers and/or acceleration servers and each server may include processors to provide data processing services. The electronic rack may further include a coolant distribution unit (CDU) and a rack management unit. The CDU may supply cooling liquid to the processors and receive the cooling liquid carrying heat exchanged from the processors. The CDU may include a liquid pump to pump the cooling liquid and a pump controller to control a pump speed of the liquid pump. The RMU may be coupled to the server blades and the CDU. The RMU may include control logic configured to determine an association between processor operating temperature and power consumption of the acceleration servers and the host servers. The control logic may further obtain a set of parameters associated with operation of the electronic rack and determine an optimal pump speed based on the set parameters and the association between temperature and power consumption of the acceleration servers and the host servers. Finally, the control logic may control the pump speed of the liquid pump via the pump controller based on the optimal pump speed.

In one embodiment, the acceleration servers may include graphics processing units (GPUs) and the host servers may include central processing units (CPUs). In one embodiment, to determine the association between processor operating temperature of the acceleration servers and the host servers the control logic is further to determine a first association between temperature and power consumption of the host servers at a first utilization of the host servers. The control logic may further determine a second association between temperature and power consumption of the acceleration servers at a second utilization of the acceleration servers. In one embodiment, to determine the optimal pump speed the control logic is to optimize an objective function based on the parameters and the pump speed of the liquid pump. Optimizing the objective function may include minimizing a result of the objective function.

In one embodiment, to obtain the parameters the control logic is to initiate performance of a commission test comprising execution of a computing task on the electronic rack. The control logic may collect the parameters based on operation of the electronic rack during the commission test. The parameters collected during the commission test may indicate initial conditions of the electronic rack. The parameters may include, for example, a pump speed, thermal resistances of cold plates coupled to processors of the acceleration servers and host servers, a temperature of the cooling liquid, a number of host server processors and acceleration server processors, and a number of host servers and acceleration servers.

According to another aspect, a method for determining optimal pump speed of a liquid pump to provide liquid cooling to an electronic rack of a data center includes determining, for an electronic rack having a plurality of server blades, each server blade including one or more servers and each server including one or more processors to provide data processing services, an association between processor operating temperature and power consumption of one or more acceleration servers and one or more host servers. The method further includes obtaining one or more parameters associated with operation of the electronic rack and determining an optimal pump speed based on the one or more parameters and the association between temperature and power consumption of the acceleration servers and the host servers. Finally, the method may include controlling a pump speed of a liquid pump via a pump controller based on the optimal pump speed.

Figure 1:
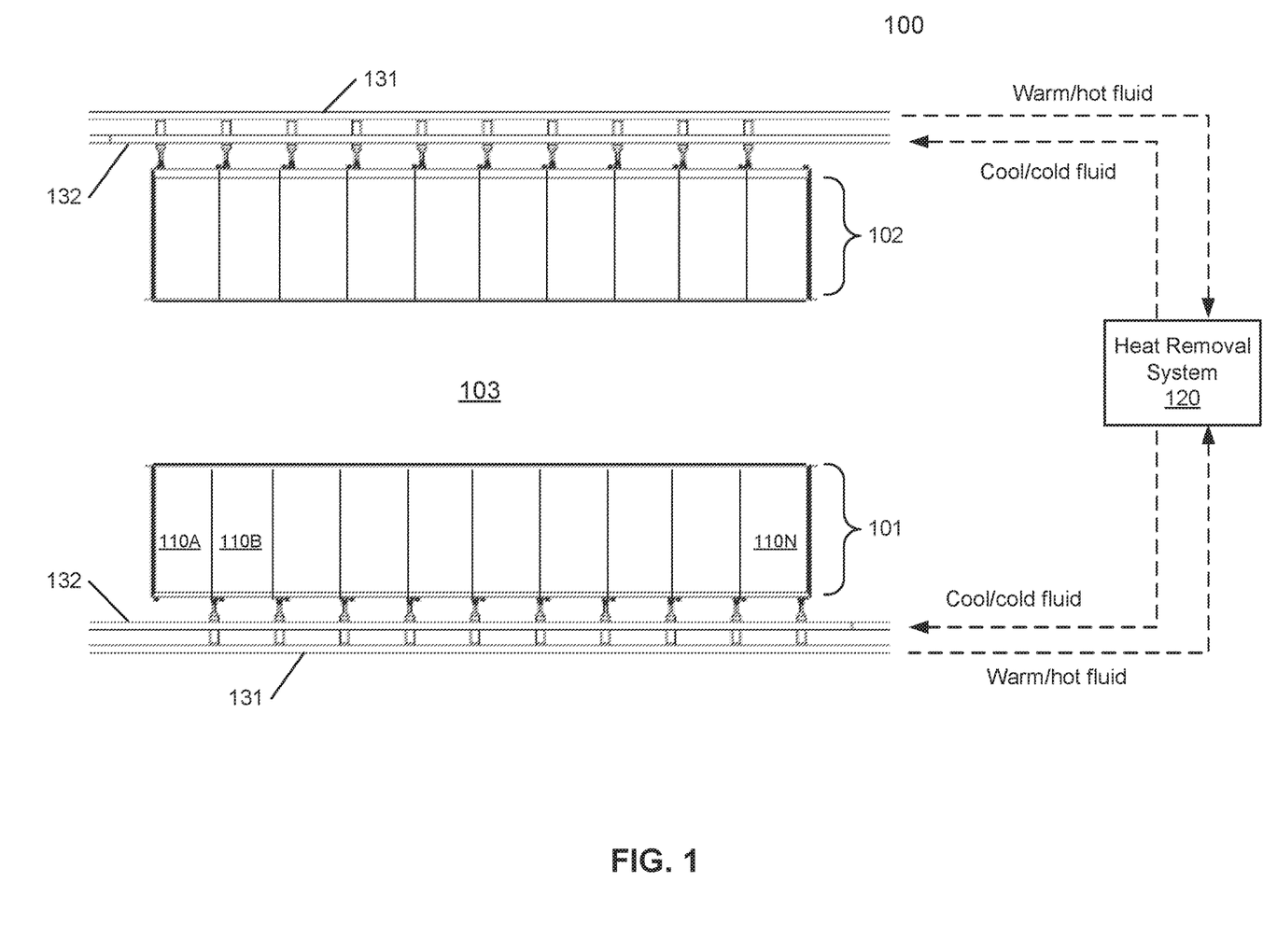
FIG. 1 is a block diagram illustrating an example of a data center system according to one embodiment.

FIG. 1 is a block diagram illustrating a data center system according to one embodiment of the invention. In this example, FIG. 1 shows a top view of at least a portion of a data center. Referring to FIG. 1, according to one embodiment, data center system 100 includes rows of electronic racks of IT components, equipment or instruments 101-102, such as, for example, computer servers that provide data services to a variety of clients. In this embodiment, data center system 100 includes electronic racks, such as electronic racks 110A-110N, arranged in row 101 and row 102. However, more or fewer rows of electronic racks may be implemented. Typically, rows 101-102 are aligned in parallel with frontends facing each other and backends facing away from each other, forming aisle 103 in between to allow an administrative person walking therein. However, other configurations or arrangements may also be applied.

In one embodiment, each of the electronic racks (e.g., electronic racks 110A-110N) includes a back panel, a number of server slots, and a number of server blades capable of being inserted into and removed from the server slots. Each server blade includes a processor (e.g., CPU or GPU), a memory, and/or a persistent storage device (e.g., hard disk), which represents a computer server. The back panel is disposed on a backend of the electronic rack. The back panel includes a heat removal liquid manifold assembly to provide heat removal liquid from an external heat removal system 120 to remove heat from the server blades. Each server blade can be inserted and removed from a corresponding server slot from a frontend of the electronic rack. Heat removal system 120 may be a chiller system with an active refrigeration cycle. Alternatively, heat removal system 120 can include, but is not limited to, evaporative cooling, free air, rejection to large thermal mass, and waste heat recovery designs.

In one embodiment, each of the electronic racks in rows 101-102 includes a heat removal liquid manifold, a number of server blades contained in a number of server blade slots respectively, and a coolant distribution unit (CDU). The heat removal liquid manifold is to provide heat removal liquid to each of the server blades. Each of the sever blades is to receive heat removal liquid from the heat removal liquid manifold to remove at least a portion of the heat generated by an IT component of the server blade using the heat removal liquid manifold, and to transmit warmer liquid carrying the heat exchanged from the IT component back to the heat removal liquid manifold. The CDU is configured to receive data representing a workload of the IT components of the server blades and to control a liquid flow rate of the heat removal liquid supplied to the heat removal liquid manifold based on the workload of the IT components of the server blades.

The heat removal liquid manifold disposed on the backend of each electronic rack is coupled to liquid supply line 132 to receive heat removal liquid from heat removal system 120. The heat removal liquid is to remove heat from the IT component. The resulting warmer or hotter liquid carrying the heat exchanged from the IT component is transmitted via return line 131 back to heat removal system 120. Liquid supply/return lines 131-132 are referred to as data center liquid supply/return lines (e.g., global liquid supply lines), which supply heat removal liquid to all of the electronic racks of rows 101-102.

Figure 2:
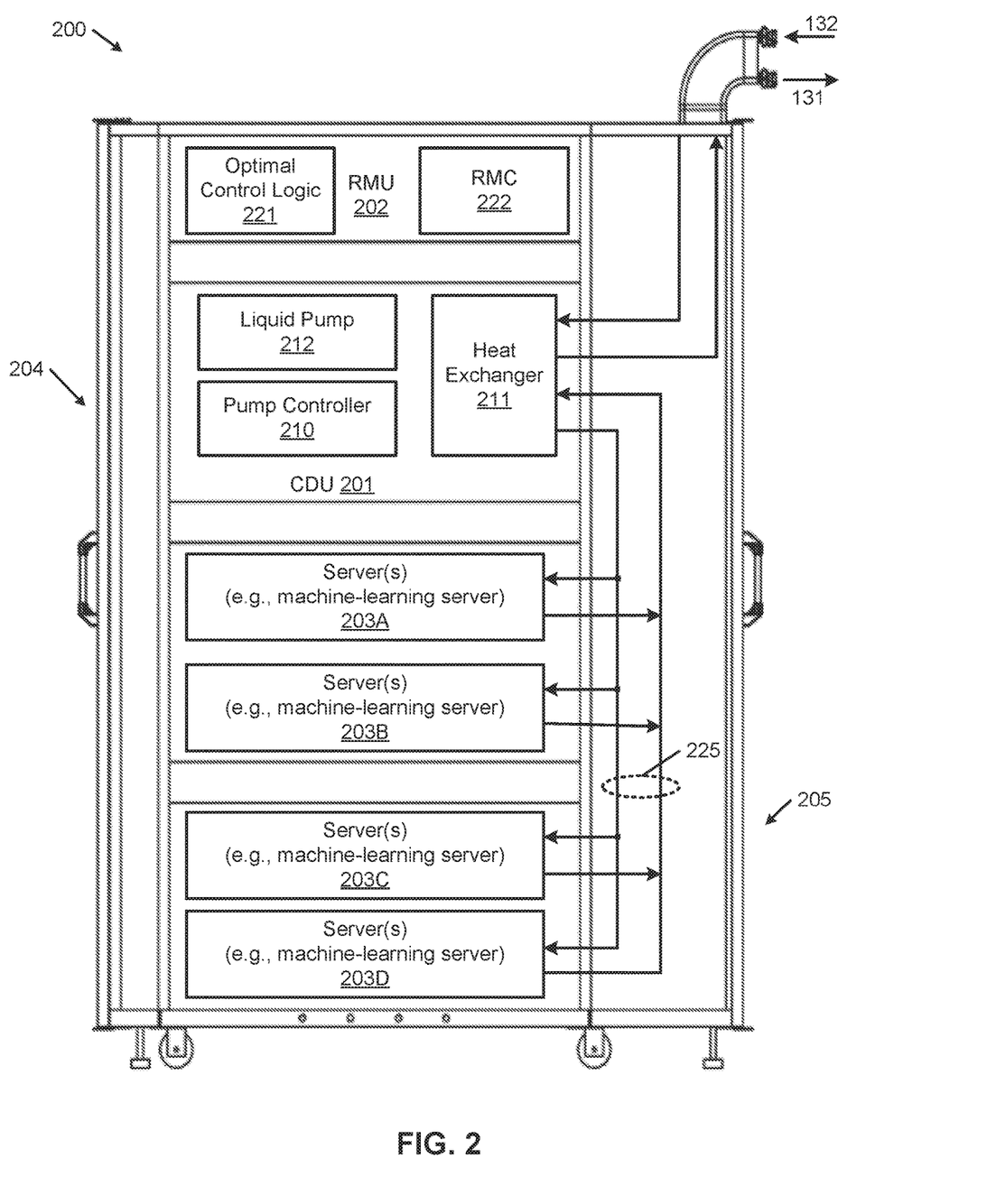
FIG. 2 is a block diagram illustrating an example of an electronic rack according to one embodiment.

FIG. 2 is a block diagram illustrating a side view of an electronic rack according to one embodiment of the invention. Electronic rack 200 may represent any of the electronic racks of rows 101-102 of FIG. 1, such as electronic racks 110A-110N. Referring to FIG. 2, in one embodiment, electronic rack 200 includes CDU 201, RMU 202, and one or more server blades 203A-203D, collectively referred to as server blades 203. Sever blades 203 can be inserted into an array of server slots respectively from frontend 204 of electronic rack 200. Note that although there are only four server blades 203A-203D shown in FIG. 2, more or fewer server blades may be maintained within electronic rack 200. Also note that the particular positions of CDU 201, CMU 202, and server blades 203 are shown for the purpose of illustration only; other arrangements or configurations of CDU 201, CMU 202, and server blades 203 may also be implemented. Further, the front door disposed on frontend 204 and the back door disposed on backend 205 are optional. In some situations, there may be no door on frontend 204 and/or backend 205.

In one embodiment, CDU 201 includes heat exchanger 211, liquid pump 212, and pump controller 210. Heat exchanger 211 may be a liquid-to-liquid heat exchanger. Heat exchanger 211 includes a first tube having a first pair of liquid connectors coupled to external liquid supply/return lines 131-132 to form a primary loop, where the connectors coupled to the external liquid supply/return lines 131-132 may be disposed or mounted on backend 205 of electronic rack 200. In addition, heat exchanger 211 further includes a second tube having a second pair of liquid connectors coupled to liquid manifold 225, which may include a supply manifold to supply cooling liquid to server blades 203 and a return manifold to return warmer liquid back to CDU 201.

The processors may be mounted on cold plates (or cold plates mounted on processors), where the cold plates include a liquid distribution channel embedded therein to receive the cooling liquid from the liquid manifold 225 and to return the cooling liquid carrying the heat exchanged from the processors back to the liquid manifold 225.

Each of server blades 203 may include one or more IT components (e.g., CPUs, GPUs, memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers may perform the actual computational tasks, which may generate heat during the operations. The compute servers may also be referred to herein as acceleration servers because they may be used to accelerate performance during training of machine learning models.

Electronic rack 200 further includes RMU 202 configured to provide and manage power supplied to server blades 203 and CDU 201. RMU 202 may be coupled to a power supply unit (not shown) to manage the power consumption of the power supply unit, as well as other thermal management of the power supply unit (e.g., cooling fans). The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimal control logic 221 and rack management controller (RMC) 222. The optimal control logic 221 is coupled to at least some of server blades 203 to receive an operating status of each of the server blades 203, such as processor temperatures of the processors, clock rate of the processors, the current pump speed of the liquid pump 212, liquid temperature of the cooling liquid, etc. Based on the received information, optimal control logic 221 may determine an optimal pump speed of the liquid pump 212 by optimizing a predetermined objective function, such that the output of the objective function reaches a minimum while a set of predetermined constraints is satisfied. For example, the objective function may represent power consumption of the entire IT rack 200 server system. RMC 222 may be configured to send a signal to pump controller 210 to control the pump speed of liquid pump 212 based on the optimal pump speed. Alternatively, the logic described above may be included in pump controller 210, or any other component of the IT rack 200.

Figure 3:
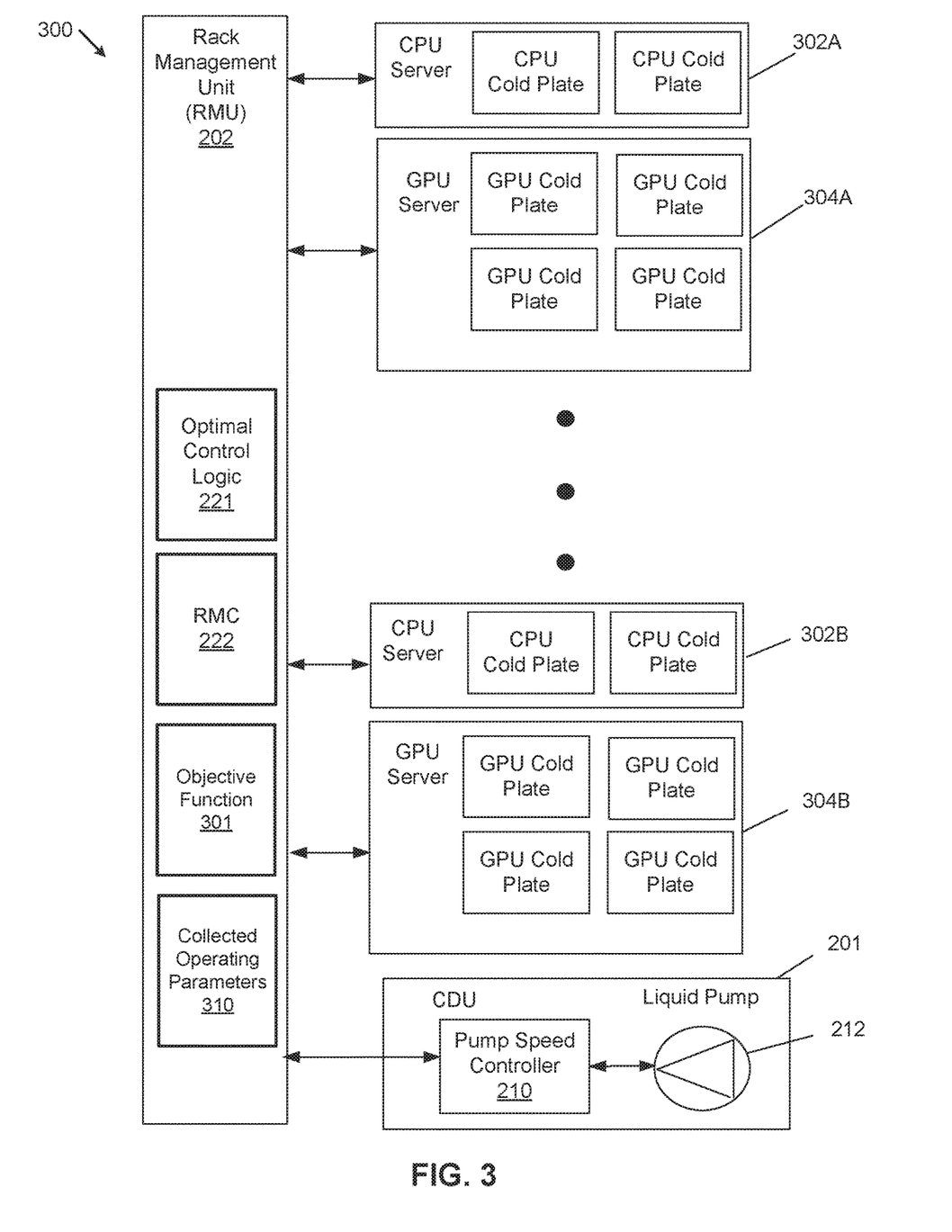
FIG. 3 is a block diagram illustrating an example of an electronic rack according to another embodiment.

FIG. 3 is a block diagram illustrating an example of a simplified electronic rack according to one embodiment. Electronic rack 300 may be implemented as a part of electronic rack, such as electronic rack 200 described with respect to FIG. 2. Referring to FIG. 3, RMU 202 is electrically coupled to servers 302A-B and 304A-B. Specifically, RMU 202 may be coupled to a baseboard management controller (BMC) of each of servers 302A-B and 304A-B. A BMC may be configured to monitor and collect an operating status of each of the components of the corresponding server, such as measuring temperatures of processors, utilization rates of servers, and a pump speed of the CDU 201. In one embodiment, IT rack 300 may perform a test run during which a set of parameters associated with operation of the IT rack may be collected. Server power consumption of both host servers and acceleration server may be dependent on the temperature at which the processors of the server are operating. Furthermore, processor operating temperature may be dependent on a pump speed of liquid pump 212. Thus, power consumption of a server may be a function of pump speed. In one embodiment, RMU 202 further includes optimal control logic 221 configured to perform an optimization of objective function 301 based on the data received from servers 203 to determine an optimal pump speed. Based on the optimal pump speed, RMC 222 sends a control signal to pump controller 210 to control the pump speed of liquid pump 212.

In one embodiment, electronic rack 300 includes an array of server blades (e.g., server blades 203 of FIG. 2) arranged in a stack. Each server blade contains one or more servers and each server includes one or more processors, such as GPUs, to provide data processing services. In one embodiment, the servers may include host servers and compute, or acceleration, servers. The host servers may be CPU servers 302A-B (collectively CPU servers 302) to receive from a client device a request to perform a service, such as executing an application or to train a machine learning model. The host server may be coupled to one or several acceleration servers (e.g., GPU servers 304A-B, collectively GPU servers 304). The host server may distribute the tasks required to complete the request to the acceleration servers. For example, to train a machine learning model, a host server may distribute the processing of training data to generate the machine learning model to the acceleration servers.

The electronic rack 300 further includes CDU 201 and RMU 202. The CDU 201 is configured to supply cooling liquid to the processors and to receive the cooling liquid carrying the heat exchanged from the processors. The CDU 201 includes a liquid pump 212 to pump the cooling liquid and a pump controller 210 to control a pump speed of the liquid pump. The RMU 202 is configured to manage the operations of the components within the electronic rack such as CDU 201, etc. The RMU 202 includes optimal control logic 221 to determine an optimal pump speed of the liquid pump 212 by optimizing an objective function 301 based on power consumption of the CDU 201, power consumption and utilization rate of CPU servers 302A-B, and power consumption and utilization rate of GPU servers 304A-B. The optimal pump speed may be used to control the pump speed of the liquid pump 212. In one embodiment, the optimal pump speed minimizes the total power consumption of the IT rack.

In one embodiment, optimizing the objective function 301 includes determining the optimal pump speed such that the objective function 301 reaches a minimum while a set of predetermined constraints is satisfied. One of the predetermined constraints may include a first condition of which the pump speed is within a defined range (e.g., between the minimum and maximum pump speed).

In one embodiment, optimal control logic 221 may be implemented in software, hardware, or a combination thereof. For example, optimal control logic 221 may be implemented as a field programmable gate array (FPGA) or an application specific integrated circuit (ASIC). Objective function 301 may be implemented as executable instructions that can be stored in a machine-readable storage medium, such as memory, and executed by optimal control logic 221.

In one embodiment, the optimal control logic 221 may consider three components in the electrical power consumption of the IT rack 300: 1) power usage by GPU servers 304; 2) power usage by CPU servers 302; and 3) power usage by cooling equipment. Each of these three components may be depend on the pump speed of the liquid pump 212 when the chip utilization information is known. The components may be described mathematically as described below.

First, the power consumption of a GPU server is related to its operating temperature. By controlling the pump speed, the flow rate of the cooling liquid traveling through the GPU cold plates is adjusted. The change in cooling liquid flow rate through the cold plates may then lead to a change in the GPU operating temperature. The GPU operating temperature may be an average value for operating temperature across all GPUs in the server. To determine the relationship between pump speed and working temperature of a GPU, optimal control logic 221 may execute a test run of a computing task on the IT rack 300. During the test run, the optimal control logic 221 may collect a set of parameters associated with the operation of the IT rack 300 (e.g., from BMCs of the servers). The parameters collected during the test run may be stored in the RMU 202, or elsewhere, as constants to be used during calculation of the optimal pump speed.

The power consumption of a single GPU may be related to the operating temperature of the GPU and liquid flow rate according to equations (1) and (2) below.

$$T_{GPU} - T_{liquid} = R_{th} P_{GPU} \quad (1)$$

$$\frac{R_{th}}{R_{th}^0} = \frac{\frac{1}{hA}}{\frac{1}{h^0 A}} = \frac{h^0}{h} = \left(\frac{V^0}{V_{GPU}}\right)^{0.8} \quad (2)$$

where $T_{GPU}$ is the GPU operating temperature; $T_{liquid}$ is the temperature of the cooling liquid flowing into the cold plate; $R_{th}$ is the thermal resistance of the cold plate; $P_{GPU}$ is the GPU power which is not determined. In equation (2), h is the equivalent heat transfer coefficient of the cold plate; A is the heat transfer area of the micro-channels inside the cold plate; $V_{GPU}$ is the flow rate of the liquid flowing through the cold plate. The upper script 0 indicates it is a parameter obtained in the test run, and is stored as a constant.

To determine the correlation between pump speed and liquid flow rate, the affinity law may be used. The affinity law, which provides that changes in pump speed proportionally effect liquid flow rate. The affinity law applies to pumps, fans, and hydraulic turbines. In these rotary implements, the affinity law applies to both centrifugal and axial flows. Based on the affinity law, after the pump speed $v_{pump}^0$ and its corresponding liquid flow rate $V_{GPU}^0$ in the test run are obtained, assuming that pump efficiency remains constant, a new liquid volumetric flow rate $V_{GPU}$ can be calculated for a different pump speed $v_{pump}$ according to the following, $$\frac{v_{pump}}{v_{pump}^0} = \frac{V_{GPU}}{V_{GPU}^0} \quad (3)$$

Plugging equations (2) and (3) into equation (1) the relation of GPU temperature to the pump speed is obtained, as shown below in equation (4).

$$T_{GPU} = T_{liquid} + \left(\frac{v_{pump}^0}{v_{pump}}\right)^{0.8} R_{th,GPU}^0 P_{GPU} \quad (4)$$

It should be noted that $P_{GPU}$ is an undetermined variable in equation (4) and that $v_{pump}$ is the controlling parameter. Parameters other than $P_{GPU}$ and $v_{pump}$ on the right side of the equation are constants in this calculation. Converting this equation from a single GPU to the server level (assuming all the GPU and the cold plates are the same) we have $$T_{GPUserver} = T_{liquid} + \frac{\left(\frac{v_{pump}^0}{v_{pump}}\right)^{0.8} R_{th,GPU}^0 P_{GPUserver}}{N_{GPU}}$$

where $N_{GPU}$ is the number of GPUs in a GPU server and $P_{GPU\ server}$ is the power usage of the entire GPU server. Therefore, equation (5) provides the temperature of the entire GPU server.

Figure 4:
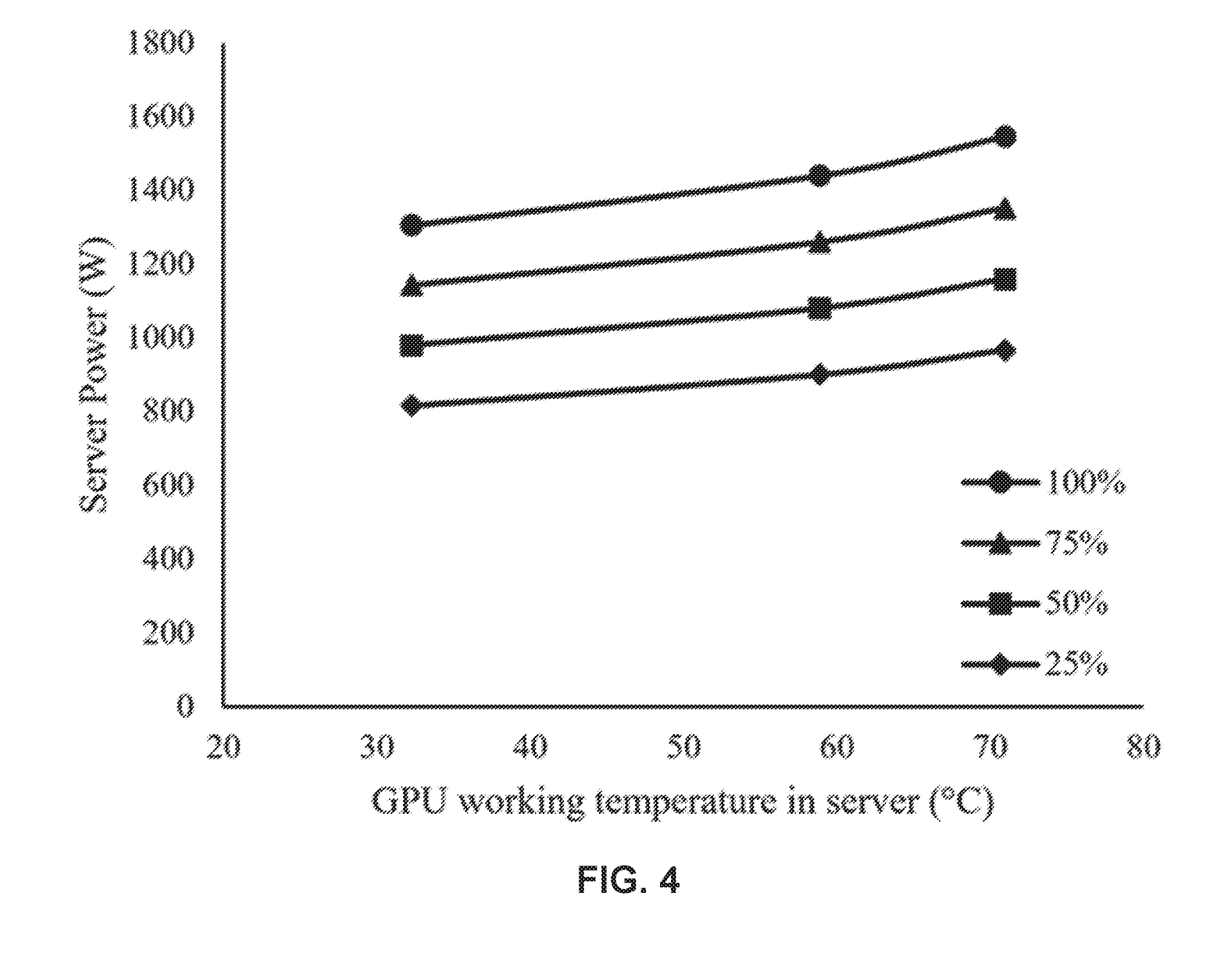
FIG. 4 is a diagram illustrating an example correlation between power consumption, temperature, and utilization of a server according to one embodiment.

As depicted in FIG. 4, the temperature of the GPU server $T_{GPU\ server}$ and the power consumption of the $P_{GPU\ server}$, may be correlated. In particular, the correlation between GPU server temperature and GPU server power consumption may depend on the utilization of the GPU server. The utilization may indicate the percentage of processing capacity of the server that is being utilized. For example, as shown in FIG. 4, the power consumption v. GPU working temperature plots may differ from 100% utilization, 75% utilization, 50% utilization, and 25% utilization. A Taylor series can be used to individually convert these curves into an r-order polynomial relation, as depicted below.

$$T_{GPU\ server} = c_r P_{PU\ server}^r + c_{r-1} P_{CPU\ server}^{r-1} + \ldots + c_1 P_{GPU\ server} + c_0 \quad (6)$$

To determine an optimal pump speed, both the correlation between power consumption and GPU working temperature at a particular utilization and Equation (5) will be used by the optimal control logic 221. Plugging Equation (6) into Equation (5) leads to the GPU server power function of pump speed below $$P_{GPU\ server} = f_{GPU}(v_{pump}) \quad (7)$$

Equation (7) illustrates that, in addition to the relation between working temperature and pump speed in Equation (5), at any particular utilization there is a correlation between GPU power and pump speed. Additionally, this relation is different at different GPU utilization levels.

Mathematically equation (7) may be an implicit equation, meaning that the unknown P GPU server may need to remain on both sides of equation (777). In the case that equation (7) is implicit, a more accurate mathematical expression of Equation (7) may be as follows, $$f'_{GPU}(v_{pump}, P_{GPU\ server}) = C \quad (8)$$

where C is a constant. However, whether or not equation (7) is explicit or implicit, for any given pump speed $v_{pump}$, a corresponding value of $P_{GPU\ server}$ can be determined by Equation (7) or (8)8. This means that the relation between GPU power usage and the pump speed can be fully described, under a certain level of GPU utilization (i.e., if the utilization is known).

The relationship between CPU server power consumption and pump speed may be determined similar to the GPU server above. As such, the working temperature of the CPU serve may be expressed as $$T_{CPU_{server}} = T_{liquid} + \frac{\left(\frac{v_{pump}^0}{v_{pump}}\right)^{0.8} R_{th,CPU}^0 P_{CPU_{server}}}{N_{CPU}} \quad (9)$$

where $N_{CPU}$ is the number of CPUs in a CPU server. A similar temperature—power curve depicted in FIG. 4 may be determined for a CPU server. Then, similar to the GPU server we have $$P_{CPU\ server} = f_{CPU}(v_{pump}) \quad (10)$$

Pump power consumption may be determined based on the following equation $$P_{pump} = b v_{pump}^3 \quad (11)$$

where b is a constant that can be obtained on pump power consumption curve.

Taking the relations defined above, the total power consumed by the GPU servers, the CPU servers and the mechanical pump in an IT rack may be represented as $$P = b v_{pump}^3 + n f_{GPU}(v_{pump}) + m f_{CPU}(v_{pump}) \quad (12)$$

where n and m are the numbers of GPU servers and CPU servers in an IT rack, respectively. Pump speed $v_{pump}$ may be the direct controlling parameter. It should be noted that this equation applies when all the CPU servers are running at the same utilization, and all the GPU servers are running at the same utilization. If there is a change utilization of the GPU servers or CPU servers, the function $f_{GPU}$ should be updated based on the corresponding server power v. GPU relation (i.e., as depicted in FIG. 4).

In one embodiment, if utilizations among GPU servers (or CPU servers) are different, in Equation (12) the term $n f_{GPU}$ becomes $f_{GPU,1} + f_{GPU,2} + \ldots$ taking into account each GPU or CPU server individually.

In summation, as the pump speed changes, the flow rates of the liquid traveling through the cold plates of the GPU servers and CPU servers change, which leads to the working temperature changes of GPU chips and CPU chips in the servers. An increase in pump speed may result in an increased pumping power consumption $P_{pump}$. However, the power consumption of the GPU servers and CPU servers may decrease due to reduced current leakage in the circuits of the silicon chips (GPUs and CPUs). In one embodiment, the pump speed value variation is bounded, and therefore an optimal pump speed $v_{pump}^*$ may be determined that results in a minimized total power consumption P.

Figure 5:
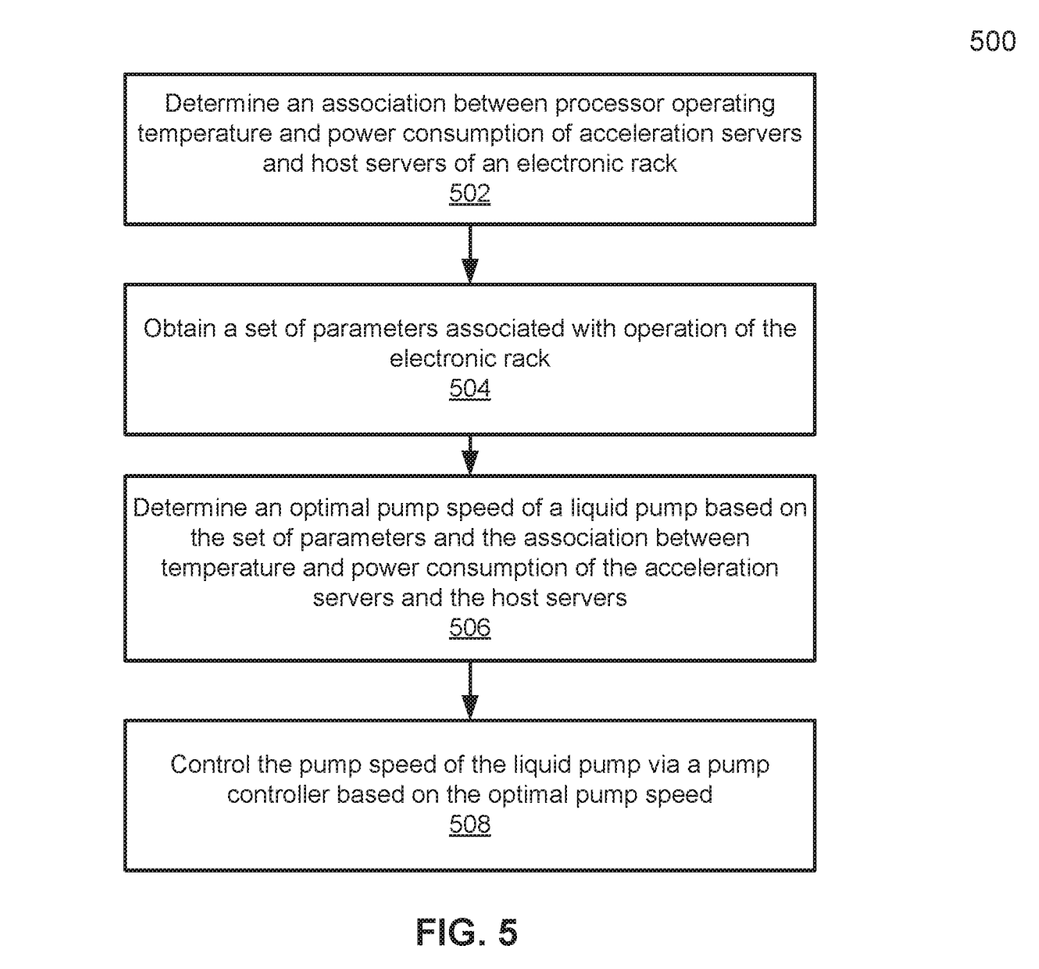
FIG. 5 is a flow diagram illustrating a process of determining an optimal pump speed in a heterogeneous computing environment according to one embodiment.

FIG. 5 is a flow diagram illustrating an example of a process for determining an optimal pump speed of a liquid pump according to one embodiment. Process 500 may be performed by processing logic which may include software, hardware, or a combination thereof. For example, process 500 may be performed by optimal control logic 221 of RMU 202 of FIG. 2.

Referring to FIG. 5, at block 502, processing logic determines an association between processor operating temperature and power consumption of acceleration servers and host servers of an electronic rack. The acceleration servers may be GPU servers and the host servers may be CPU servers. The association may include an association between temperature and power consumption of the CPU servers at a particular CPU server utilization. The association may also include an association between temperature and power consumption of the GPU servers at a particular GPU utilization. The CPU utilization and the GPU utilization may be different.

At block 504, processing logic obtains a set of parameters associated with operation of the electronic rack. The parameters may be obtained during execution of a commission test, or test run. The test run may include executing a compute task on the IT rack. The parameters may indicate initial conditions of the IT rack which may be used to calculate later conditions of the IT rack. The parameters may include, for example, a pump speed, thermal resistances of cold plates coupled to processors of the acceleration servers and host servers, a temperature of the cooling liquid, a number of host server processors and acceleration server processors, and a number of host servers and acceleration servers.

At block 506, processing logic determines an optimal pump speed of a liquid pump based on the set of parameters and the association between temperature and power consumption of the acceleration servers and host servers. Determining the optimal pump speed may include optimizing an objective function based on the parameters collected during the test run. The objective function may include the parameters collected during the test run as constants. The objective function may represent the total power consumption of the IT rack in view of GPU servers, CPU servers, and a liquid pump Therefore, the optimal pump speed may minimize the total power consumption of the IT rack. At block 508, processing logic controls the pump speed of the liquid pump via a pump controller based on the optimal pump speed.

Figure 6:
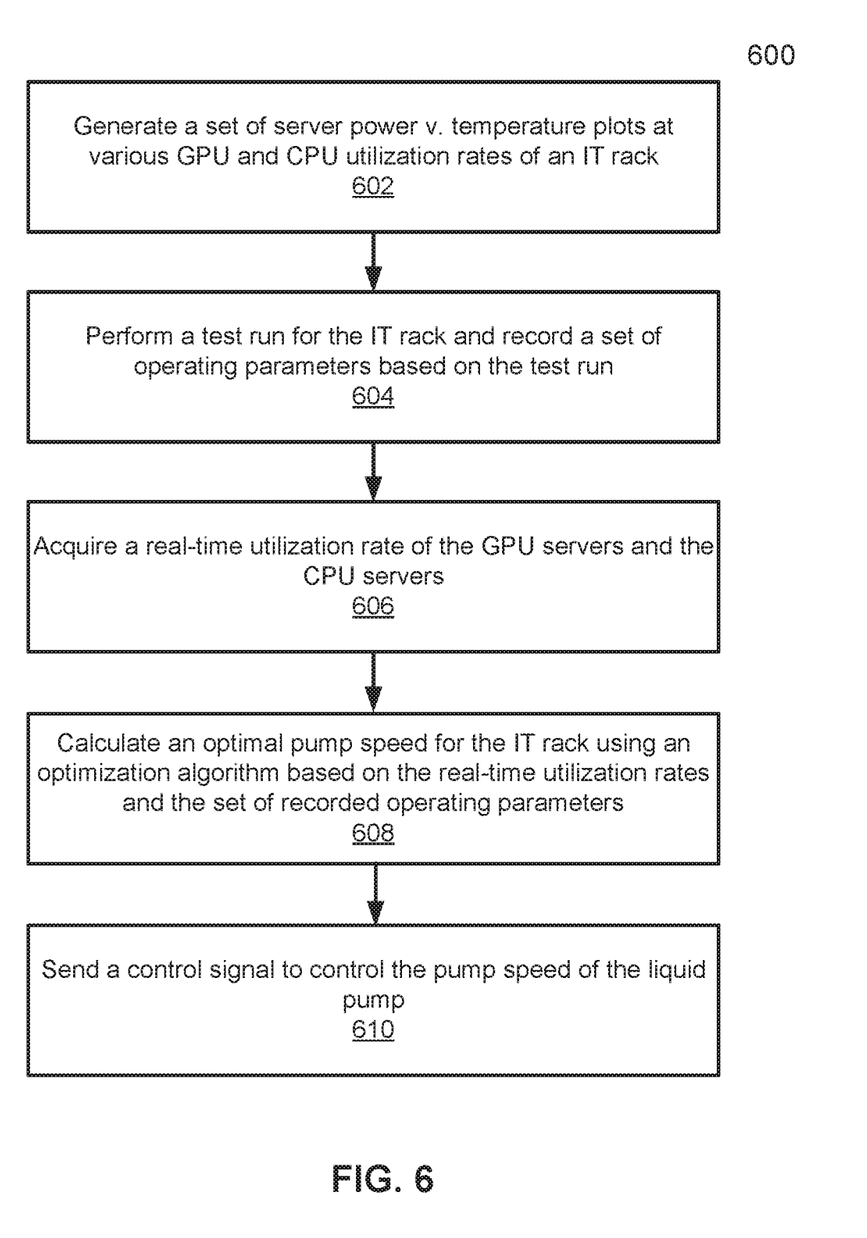
FIG. 6 is a flow diagram illustrating a process of determining an optimal pump speed in a heterogeneous computing environment according to another embodiment.

FIG. 6 is a flow diagram illustrating an example of a process for determining an optimal pump speed of a liquid pump according to one embodiment. Process 600 may be performed by processing logic which may include software, hardware, or a combination thereof. For example, process 600 may be performed by optimal control logic 221 of RMU 202 of FIG. 2.

Referring to FIG. 6, at block 602, processing logic generates a set of server power usage versus operating temperature plots at various GPU and CPU utilization rates of an IT rack. The GPU servers and CPU servers may have different power usage v. operating temperature plots even at the same utilizations. Additionally, the power usage v. temperature plots may be different and unique at each utilization.

At block 604, processing logic performs a test run for the IT rack and records a set of operating parameters based on the test run. The test run may include executing a sample compute task during which the parameters may be collected. The parameters may include, for example, a pump speed, thermal resistances of cold plates coupled to processors of the acceleration servers and host servers, a temperature of the cooling liquid, a number of host server processors and acceleration server processors, and a number of host servers and acceleration servers.

At block 606, processing logic acquires a real-time utilization rate for the GPU servers and the CPU servers. The processing logic may use the real-time utilization rate to identify the power usage v. operating temperature plots for a utilization most closely corresponding to the real-time utilization.

At block 608, processing logic calculates an optimal pump speed for the IT rack using an optimization algorithm based on the real-time utilization rates and the set of recorded operating parameters. The optimization algorithm may minimize the power consumption for the IT rack. The real-time utilization rates may determine the power usage v. temperature relation for the GPUs and CPUs. The pump speed may be directly related to the temperature of the GPUs and CPUs. Therefore, the power consumption of the GPUs and CPUs are directly dependent on the pump speed. Additionally, power consumption of the liquid pump may depend directly on the pump speed. Therefore, the processing logic may determine an optimal pump speed which minimizes the power consumption of the IT rack considering the GPU power consumption, CPU power consumption, and the liquid pump power consumption. At block 610, processing logic sends a control signal to control the pump speed of the liquid pump.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method comprising:
    determining, for an electronic rack having a plurality of server blades, each server blade including a plurality of servers and each server including one or more processors to provide data processing services, an association between processor operating temperature and power consumption of the plurality of servers comprising one or more acceleration servers and one or more host servers;
    collecting, by processing logic, a set of parameters based on operation of the electronic rack during execution of a computing task, wherein the set of parameters are stored in a memory;
    determining, by the processing logic, an optimal pump speed based on the set of parameters and the association between operating temperature and power consumption of the acceleration servers and the host servers; and
    controlling a pump speed of a liquid pump via a pump controller based on the optimal pump speed.

2. The method of claim 1, wherein the one or more acceleration servers comprise one or more graphics processing units (GPUs) and the one or more host servers comprise one or more central processing units (CPUs).

3. The method of claim 1, wherein determining the association between the processor operating temperature of the acceleration servers and the host servers further comprises:
    determining a first association between processor operating temperature and power consumption of the host servers at a first utilization of the host servers; and
    determining a second association between processor operating temperature and power consumption of the acceleration servers at a second utilization of the acceleration servers.

4. The method of claim 1, wherein determining the optimal pump speed comprises:
    optimizing an objective function based on the set of parameters and the pump speed of the liquid pump, wherein optimizing the objective function comprises minimizing a result of the objective function.

5. The method of claim 1, further comprising:
    initiating performance of a commission test comprising execution of the computing task; and
    performing the collecting of the set of parameters during the commission test.

6. The method of claim 5, wherein the set of parameters collected during the commission test indicate initial conditions of the electronic rack.

7. The method of claim 5, wherein the set of parameters collected during the commission test comprise a pump speed, thermal resistances of cold plates coupled to processors of the acceleration servers and host servers, a temperature of the cooling liquid, a number of host server processors and acceleration server processors, and a number of host servers and acceleration servers.

* * * * *